A method for crystallizing an amorphous film by doping phosphorus and using FE-MIC, and method for fabrication an LCD by using the same. The method for crystallizing an amorphous film includes forming an amorphous film containing an impurity on a substrate, forming a metal layer on the amorphous film, heat treating the amorphous film, and applying an electric field to the amorphous film.

(12) United States Patent
Jang et al.

(10) Patent No.: US 6,835,608 B2
(45) Date of Patent: Dec. 28, 2004

(54) METHOD FOR CRYSTALLIZING AMORPHOUS FILM AND METHOD FOR FABRICATING LCD BY USING THE SAME

(75) Inventors: Jin Jang, Seoul (KR); Kyung Ho Kim, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 3 days.

(21) Appl. No.: 10/189,511

(22) Filed: Jul. 8, 2002

(65) Prior Publication Data
US 2003/0013278 A1 Jan. 16, 2003

(30) Foreign Application Priority Data
Jul. 10, 2001 (KR) .......... 2001-41379

(51) Int. Cl.[7] .......... H01L 21/00; H01L 21/84
(52) U.S. Cl. .......... 438/166; 438/149; 438/152
(58) Field of Search .......... 438/149–166

(56) References Cited

U.S. PATENT DOCUMENTS

| | | | | |
|---|---|---|---|---|
| 5,403,756 A | * | 4/1995 | Yoshinouchi et al. | 438/162 |
| 5,559,344 A | * | 9/1996 | Kawachi | 257/57 |
| 6,221,702 B1 | * | 4/2001 | Joo et al. | 438/166 |
| 6,225,197 B1 | * | 5/2001 | Maekawa | 438/487 |
| 6,297,080 B1 | * | 10/2001 | Lee et al. | 438/151 |
| 6,306,692 B1 | * | 10/2001 | Seo et al. | 438/149 |
| 6,309,951 B1 | * | 10/2001 | Jang et al. | 438/486 |
| 6,312,979 B1 | * | 11/2001 | Jang et al. | 438/166 |
| 6,342,409 B1 | * | 1/2002 | Seo | 438/161 |
| 6,500,736 B2 | * | 12/2002 | Kim et al. | 438/486 |
| 6,524,662 B2 | * | 2/2003 | Jang et al. | 427/535 |
| 2002/0086470 A1 | * | 7/2002 | Kim et al. | 438/166 |
| 2003/0013237 A1 | * | 1/2003 | Jang et al. | 438/151 |
| 2003/0013279 A1 | * | 1/2003 | Jang et al. | 438/486 |

* cited by examiner

Primary Examiner—John F. Niebling
Assistant Examiner—Jennifer M. Kennedy
(74) Attorney, Agent, or Firm—McKenna Long & Aldridge LLP

(57) ABSTRACT

33 Claims, 7 Drawing Sheets

METHOD FOR CRYSTALLIZING AMORPHOUS FILM AND METHOD FOR FABRICATING LCD BY USING THE SAME

This application claims the benefit of Korean Application No. P2001-41379 filed on Jul. 10, 2001, which is hereby incorporated by reference for all purposes as if fully set forth herein.

BACKGROUND OF THE INVENTION

1. Field of the Invention

The present invention relates to a method for crystallizing an amorphous film, and more particularly, to a method for crystallizing an amorphous film for enhancing crystallinity, and a method for fabricating a liquid crystal display (LCD) by using the same.

2. Background of the Related Art

As devices become larger, and more integrated, switching devices become thinner. Consequently the present amorphous silicon thin film transistors are replaced with polycrystalline thin film transistors.

With a process temperature below 350° C., though the amorphous silicon thin film transistor can be fabricated on a glass substrate with ease, it is difficult to employ the amorphous silicon thin film transistor in a fast operation circuit due to low mobility.

However, as the polycrystalline silicon has a mobility higher than amorphous silicon, a driving circuit can be fabricated on a glass substrate. Therefore, the polycrystalline silicon is preferable for a switching device of a high resolution, large sized device.

The polycrystalline silicon may be formed by direct deposition of the polycrystalline silicon, or crystallizing amorphous silicon after the amorphous silicon is deposited.

The direct deposition method includes Low-Pressure Chemical Vapor Deposition (LPCVD), Plasma Enhanced Chemical Vapor Deposition (PECVD), and the like. LPCVD is disadvantageous in that it requires expensive silica or quartz as opposed to a glass substrate due to the deposition of polycrystalline silicon at an elevated temperature higher than 550° C. PECVD includes depositing by using a mixture gas of $SiF_4/SiH_4/H_2$, which has poor thin film characteristics even though deposition at a low temperature below 400° is possible. Therefore, the latter method is widely employed.

The crystallizing method includes Solid Phase Crystallization (SPC), Excimer Laser Annealing (ELA), Metal Induced Crystallization (MIC), including Field Enhanced-Metal Induced Crystallization (FE-MIC), and the like. SPC is comparatively simple since it only requires a long time period of heat treatment in a furnace of where temperature is more than 600° C. for forming the polycrystalline film. A high crystallization temperature and a long heat treatment time period ($\geqq 20$ hrs) are essential. SPC has disadvantages in that fabrication of a device by SPC has many difficulties because SPC causes many defects inside of crystallized grains, and the glass substrate cannot be used due to the high crystallizing temperature.

In ELA, crystallizing a thin film by irradiating an excimer laser with a short wave length and a high energy, momentarily facilitates a low temperature crystallization at a temperature below 400° C., and produces a large sized crystalline grain with excellent properties. However, since ELA progresses non-uniform crystallization and requires expensive equipment, ELA is not suitable for mass production and fabrication of large sized devices.

There are other methods including a method for inducing crystallization by adding impurities, such as germanium (Ge), a method for crystallizing a thin film by using microwave, and the like, however no excellent device characteristics are obtainable yet.

Among these methods, there is the FE-MIC method in which a catalytic metal is added to an amorphous silicon thin film, and an electric field is applied thereto for crystallization. A crystallization reaction occurs at a relatively low temperature as the catalytic metal in contact with the amorphous silicon thin film decreases a bonding energy of the silicon. The crystallization temperature of the thin film decreases significantly, shortening the crystallization time period. These are all favorable for large sized glass substrate applications.

In general, FE-MIC is influenced by an amount of the catalytic metal; the more the catalytic metal, the lower the crystallization temperature.

In the meantime, there are three important factors that influence the crystallization of an amorphous silicon thin film; an incubation time period, a nucleation rate, and a grain growth rate.

The incubation time period is a time period required until crystallized nuclei appear, and the nucleation rate and the grain growth rate are the rates at which crystallized nuclei form and grow. Therefore, to have no defects and an increasing grain size, the nucleation rate is required to be reduced and the grain growth rate increased.

The steps of a related art method for crystallizing an amorphous film, and the steps of a related art method for fabricating an LCD by using the same will be explained, with reference to the attached drawings.

FIGS. 1A–1C illustrate the steps of a related art method for crystallizing an amorphous silicon film. The steps of a related art method for crystallizing an amorphous film will be explained.

Referring to FIG. 1A, a buffer layer 2 is formed on a substrate 1, and an amorphous silicon film 3 is deposited thereon at 300–400° C. by Plasma Enhanced CVD (PECVD), Low-Pressure CVD (LPCVD) using silane gas, or by sputtering, to form an amorphous silicon thin film.

Next, referring to FIG. 1B, a metal, such as nickel, is deposited on the amorphous thin film 3 by using plasma of a non-reactive gas to form a catalytic metal layer 4.

Then, referring to FIG. 1C, an electric field is applied to the amorphous silicon thin film 3 having the catalytic metal layer 4 formed thereon by means of electrodes 5 formed at both ends thereof, to make free electrons in the catalytic metal layer active. Then, free electrons of the nickel decrease the bonding energy of the silicon, resulting in a decrease in crystallization temperature, and the nickel atoms diffuse into the silicon layer, to form nickel silicide $NiSi_2$.

Then, the nickel silicide causes the growth of needle-like forms of crystalline grains in an <111> orientation direction, resulting in crystallization of the amorphous silicon thin film 3 into a polycrystalline silicon thin film.

FE-MIC can shorten the crystallization time period extremely and decrease the crystallization temperature required in the present MIC by applying an electric field to the amorphous silicon thin film containing a catalytic metal. By applying the foregoing method for crystallizing an amorphous film to semiconductor devices and LCDs, devices having a high mobility can be fabricated.

The step of the related art method for fabricating an LCD by using the FE-MIC will be explained.

First, the polycrystalline silicon thin film is patterned, to form an active semiconductor layer, and a silicon nitride SiNx is deposited on an entire surface including the semiconductor layer, to form a gate insulating film.

Then, a low resistance metal film is deposited on the gate insulating film, patterned by photolithography, to form a gateline and a gate electrode, and impurities are injected into the semiconductor layer with the gate patterns used as mask, to form source/drain regions.

Next, source/drain electrodes are formed for connecting the dataline perpendicular to the gateline and the source/drain regions. The data patterns are insulated from the gate patterns by an interlayer insulating film.

Then, a protection film is formed on an entire surface including the source/drain electrodes, and a pixel electrode is formed connected to the drain electrode through the protection film, thereby completing fabrication of an array substrate of an LCD.

When a color filter substrate is bonded to the array substrate, and a liquid crystal layer is formed between the two substrates, the LCD is formed.

However, the related art method for crystallizing an amorphous film, and a method for fabricating an LCD by using the same have the following problems.

Though the FE-MIC can decrease the crystallization temperature of an amorphous silicon by increasing a grain growth rate, FE-MIC has the limitation of a small grain size for the polycrystalline silicon.

If the grain size is not adequately large, there are many grain boundaries between grains that impede immigration of the electrons, to reduce the mobility of the device.

SUMMARY OF THE INVENTION

Accordingly, the present invention is directed to a method for crystallizing an amorphous film, and a method for fabricating an LCD by using the same that substantially obviates one or more of the problems due to limitations and disadvantages of the related art.

An advantage of the present invention is to provide a method for crystallizing an amorphous film, and a method for fabricating an LCD by using the same, which can enhance a crystallinity of grains.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for crystallizing an amorphous film includes forming an amorphous film containing an impurity on a substrate; forming a metal layer on the amorphous film; heat treating the amorphous film; and applying an electric field to the amorphous film.

In another aspect of the present invention, there is provided a method for fabricating a liquid crystal display, including forming an amorphous thin film containing an impurity on a first substrate; forming a metal layer on the amorphous thin film; heat treating and applying an electric field to the amorphous film, to crystallize the amorphous film; patterning the crystallized amorphous silicon thin film to form a semiconductor layer; forming a gate electrode in a region of the semiconductor layer insulated from the semiconductor layer; forming source/drain regions by injecting ions into the semiconductor layer; forming source/drain electrodes connected to the source/drain regions respectively; forming a pixel electrode connected to the drain electrode; and forming a liquid crystal layer between the first substrate and a second substrate opposite to the first substrate.

That is, the present invention is characterized in that a grain size is made as large as possible by crystallizing an impurity doped amorphous film by FE-MIC, for enhancing a mobility of a device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

First Embodiment

FIGS. 2A–2E illustrate the steps of a method for crystallizing an amorphous silicon film in accordance with a first embodiment of the present invention. The first embodiment is characterized in that, after a catalytic metal is deposited on an amorphous silicon thin film containing an impurity, the amorphous silicon thin film is crystallized by Field Enhanced-Metal Induced Crystallization (FE-MIC).

Figure 1A:
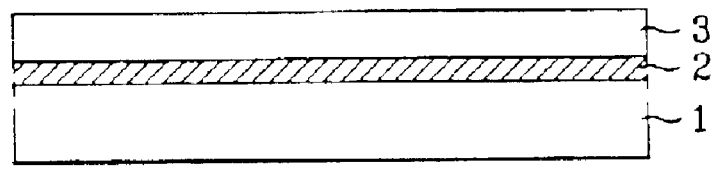
FIGS. 1A–1C illustrate the steps of a related art method for crystallizing an amorphous silicon film.
Figure 1B:
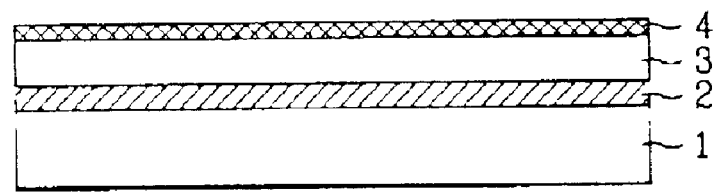
Figure 1C:
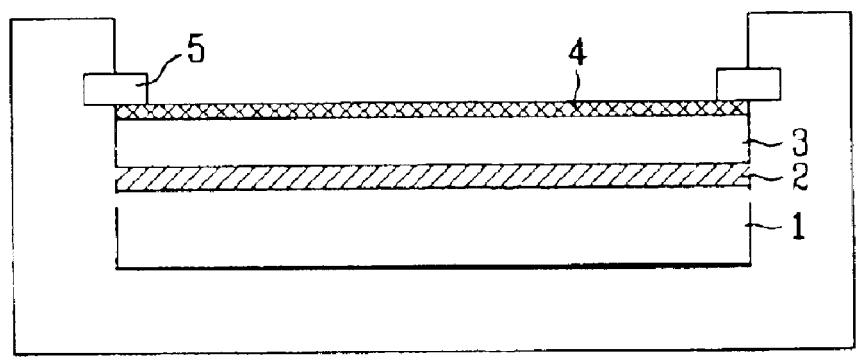
Figure 2A:
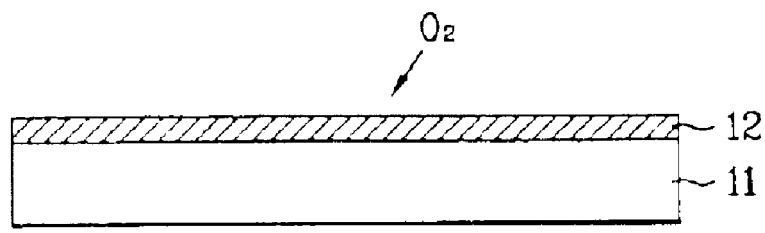
FIGS. 2A–2E illustrate the steps of a method for crystallizing an amorphous silicon film in accordance with a first embodiment of the present invention.

Referring to FIG. 2A, a silicon film is formed on a substrate 11, and brought into contact and chemically react with oxygen $O_2$ or water vapor at an elevated temperature ranging from about 800–1200° C., to form a silicon oxide film ($SiO_2$) buffer layer 12.

The silicon oxide film 12 prevents impurities in the substrate 11 from diffusing into the amorphous silicon thin film 13 (shown in FIG. 2B), and cuts off a thermal flow into the substrate 11 in a later crystallization step.

Figure 2B:
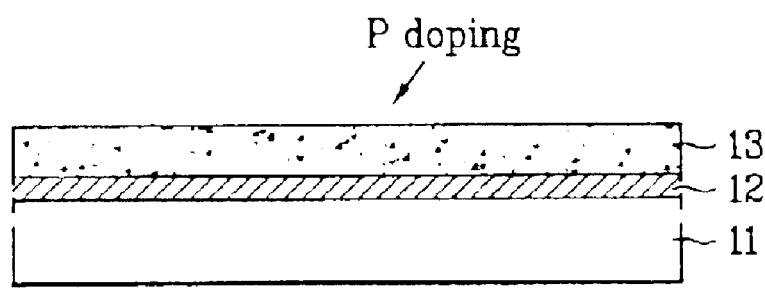

Referring to FIG. 2B, amorphous silicon is deposited on the silicon oxide film 12 at about 300–400° C. by Plasma Enhanced Chemical Vapor Deposition (PECVD), Low-Pressure Chemical Vapor Deposition (LPCVD) using silane gas, or by sputtering, to form the amorphous silicon thin film 13.

Next, phosphorous (P) ions are doped in the amorphous silicon thin film 13 of about a 10×10 cm² test piece size at a dose of about $10^{11}$–$10^{13}$ cm$^{-2}$ by using an ion beam. Besides phosphorous, fluoride (F) or chloride (Cl) may be used as a dopant.

The doping of the impurity ions in the amorphous silicon thin film 13 elevates a Fermi level of the amorphous silicon, to reduce an activation energy of an electric conductivity. Also, the doping of the impurity ions in the amorphous silicon thin film 13 reduces a concentration of crystallized nuclei formed during an initial crystallization, to form larger grains, thereby enhancing the crystallinity.

Figure 2C:
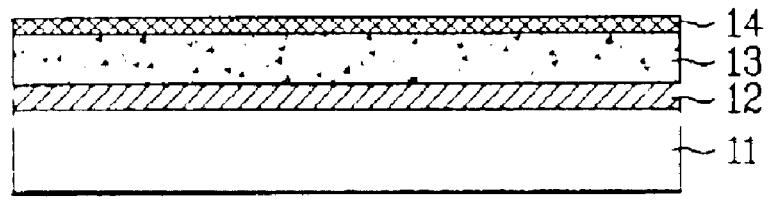

Then, referring to FIG. 2C, a catalytic metal 14 is deposited on the amorphous silicon thin film 13 at about $5\times10^{12}$–$10^{14}$ cm$^{-2}$, uniformly. Nickel (Ni) or cobalt (Co) is employed as the catalytic metal 14 because silicide of the nickel or cobalt has the least lattice mismatch probability.

The catalytic metal 14 is deposited by plasma of a non-reactive gas, by an ion beam, or by a metal solution, for deposition of a small amount of the catalytic metal.

It is important to control the amount of the catalytic metal. If the catalytic metal is excessive, though the crystallization temperature decreases, a leakage current occurs due to remaining catalytic metal, and forms relatively more grains, that impede grain growth.

Particularly, the concentration of crystallized nuclei is required to be reduced for enhancing the crystallinity because boundaries between grains formed as a grain grown from one nucleus meets with an adjacent grain which deteriorates the quality of polycrystalline silicon.

Figure 2D:
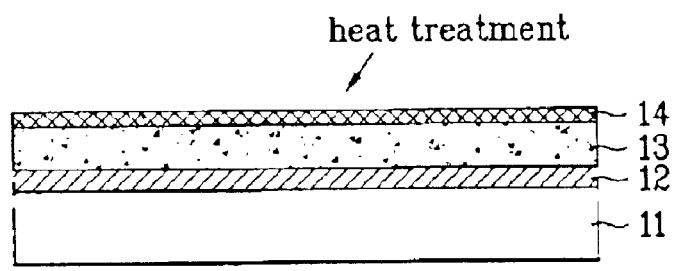

Referring to FIG. 2D, an annealing is carried out for heat treating the amorphous silicon thin film 13. In this instance, the catalytic metal diffuses to the silicon layer from an interface with the silicon layer, to form silicide that accelerates the crystallization and decreases the crystallization temperature.

Figure 2E:
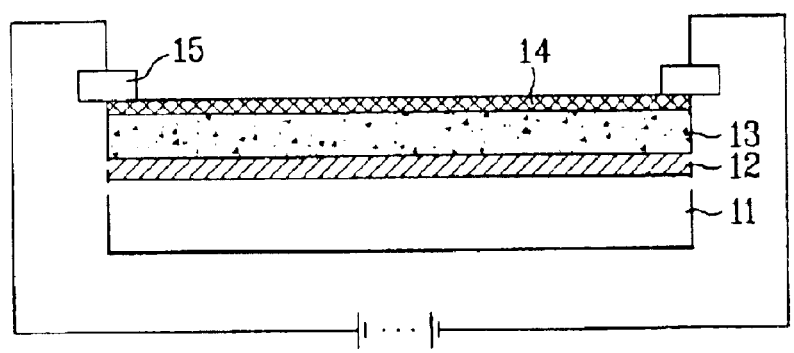

Next, referring to FIG. 2E, electrodes 15 are provided on opposite ends of the amorphous silicon 13 having the catalytic metal 14 disposed thereon.

The electrodes are formed of molybdenum (Mo), graphite, or the like, and electric field has an intensity ranging from about 0–500 V/cm, and is varied with time.

The application of the electric field may be after the annealing as above or between the catalytic metal deposition and the annealing, or simultaneous with the annealing.

Thus, the crystallization of phosphorous doped amorphous silicon by FE-MIC, a low temperature crystallization method by using a catalytic metal, provides a polycrystalline silicon thin film having an excellent crystallinity.

Second Embodiment

Figure 3:
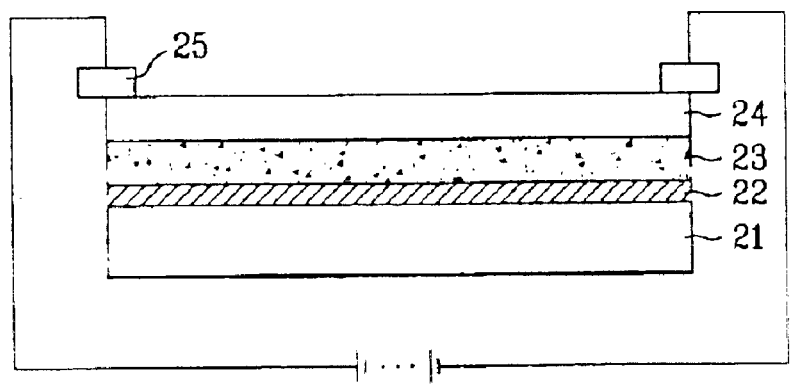
FIG. 3 illustrates a method for crystallizing an amorphous silicon film in accordance with a second embodiment of the present invention.

FIG. 3 illustrates a method for crystallizing an amorphous silicon film in accordance with a second embodiment of the present invention. The second embodiment is characterized in that, after a second amorphous silicon thin film containing a catalytic metal is formed on a first amorphous silicon thin film containing an impurity, the amorphous silicon thin film is crystallized by FE-MIC.

In detail, referring to FIG. 3, a silicon oxide (SiO$_2$) film buffer layer 22 is formed on a substrate 21.

Then, a first amorphous silicon thin film 23 is formed on the silicon oxide film 22 by PECVD, LPCVD using silane gas, or by sputtering.

Next, phosphorous (P) ions are doped in the first amorphous silicon thin film 23 of about a 10×10 cm² test piece size at a dose of about $10^{11}$–$10^{13}$cm$^{-2}$ by using an ion beam. Besides phosphorous, fluoride (F) or chloride (Cl) may be used as a dopant.

Then, after a first annealing is carried out, in which the first amorphous silicon thin film 23 is heat treated, another amorphous silicon containing a catalytic metal in a range of about $5\times10^{12}$–$10^{14}$ cm$^{-2}$ is deposited on the first amorphous silicon thin film 23, to form a second amorphous silicon thin film 24. In this instance, the first annealing may be omitted.

As the catalytic metal, nickel (Ni) or cobalt (Co) is used in the formation of the silicide, and the catalytic metal may be contained in the amorphous silicon thin film 24 by using a plasma gas, an ion beam, or a metal solution.

It is important to control the catalyst so that a small amount of the catalytic metal is contained, because excessive catalytic metal causes a leakage current to occur due to remaining catalytic metal, and the growth of the grain due to numerous crystallization nuclei is restricted. The small grain size increases boundaries of the grains that impede mobility and deteriorate the quality of the polycrystalline silicon thin film.

Then, a second annealing is carried out, in which the second amorphous silicon thin film 24 is heat treated, when the catalytic metal in the second amorphous silicon thin film 24 is diffused, to form a silicide phase, in which silicide accelerates the crystallization, and decreases the crystallization temperature.

Electrodes 25 are provided on opposite ends of the second amorphous silicon 24 having the catalytic metal disposed thereon.

The electrodes are formed of molybdenum (Mo), graphite, or the like, and the electric field has an intensity ranging from about 0–500 V/cm, and is varied with time.

The application of the electric field may be before or after the second annealing, or simultaneous with the second annealing.

Thus, the crystallization of phosphorous doped amorphous silicon by FE-MIC, a low temperature crystallization by using a catalytic metal, provides a polycrystalline silicon thin film having an excellent crystallinity.

Figure 4:
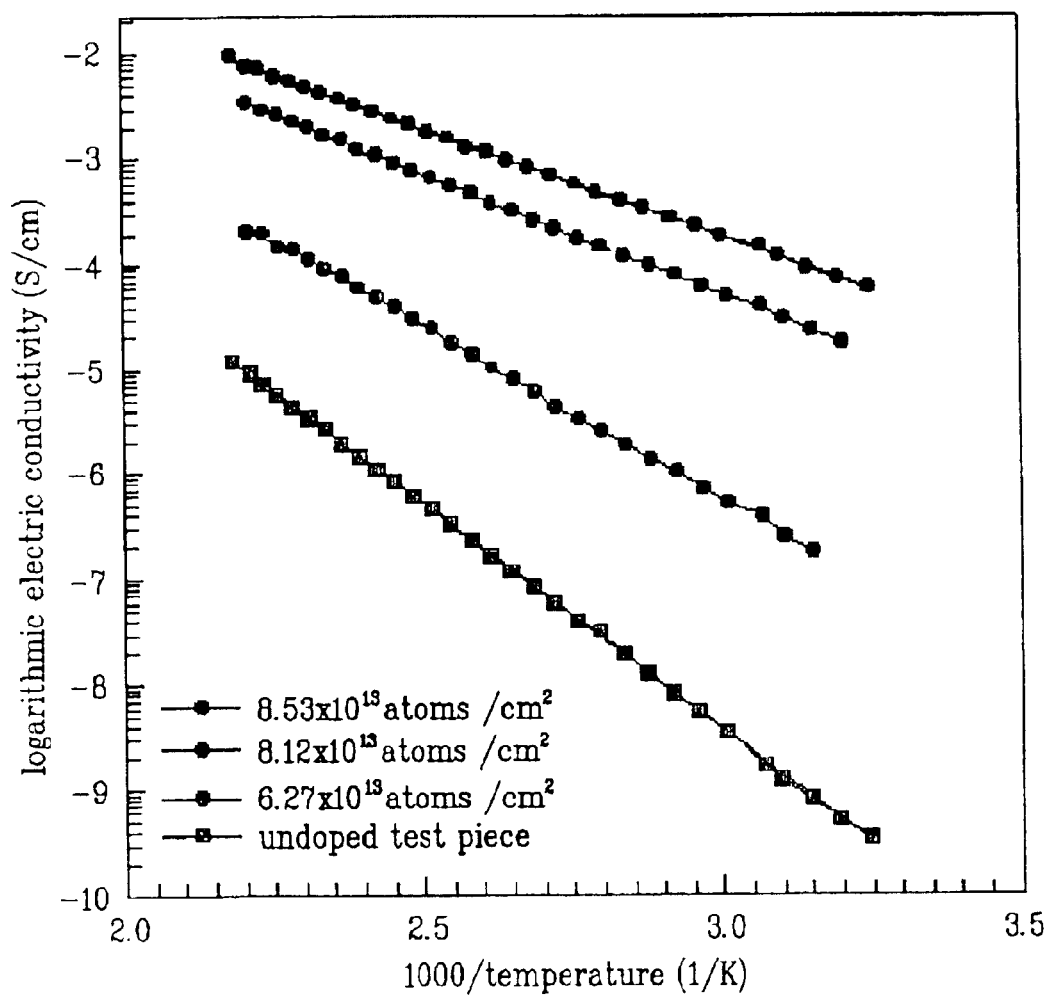
FIG. 4 illustrates a graph showing electric conductivity characteristics of a polycrystalline silicon thin film of the present invention.

FIG. 4 illustrates a graph showing electric conductivity characteristics of a polycrystalline silicon thin film of the present invention FIG. 4 illustrates a graph showing electric conductivity characteristics vs. phosphorus dose in an amorphous silicon thin film, wherein it can be noted that an electrical conductivity activation energy (Ea) of an amorphous silicon thin film without phosphorous doped therein is about 0.856 eV. The Ea of the amorphous silicon thin film with about $6.27\times10^{13}$ atoms/cm² phosphorous doped therein is about 0.657 eV. The Ea of the amorphous silicon thin film with about $8.12\times10^{13}$ atoms/cm² phosphorous doped therein is about 0.458 eV. The Ea of the amorphous silicon thin film with about $8.53\times10^{13}$ atoms/cm² phosphorous doped therein is about 0.407 eV.

As a result of the above, it can be shown that the higher the dose of impurity, the higher the Fermi levels of the amorphous silicon, with consequential decrease of the Ea of the doped amorphous silicon thin film.

Figure 5A:
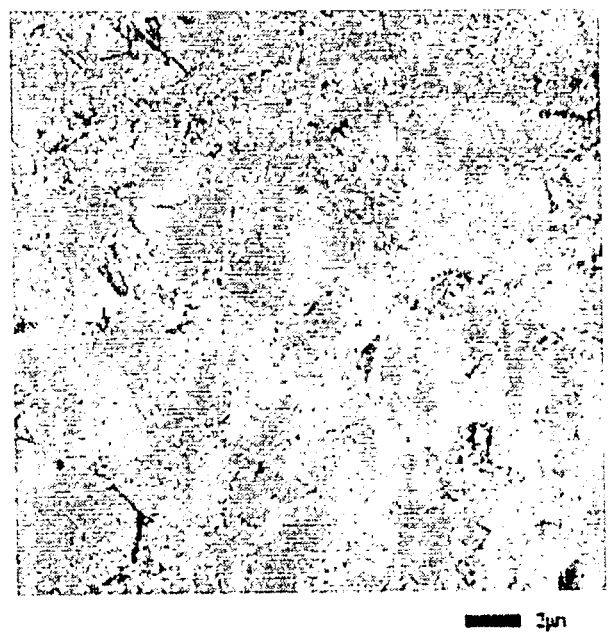
FIG. 5A illustrates a Transmission Electron Microscope (TEM) photograph of a polycrystalline silicon thin film crystallized in a state where no phosphorous is doped therein.

FIG. 5A illustrates a Transmission Electron Microscope (TEM) photograph of a polycrystalline silicon thin film crystallized in a state where no phosphorous is doped therein.

Figure 5B:
FIG. 5B illustrates a Transmission Electron Microscope (TEM) photograph of a polycrystalline silicon thin film crystallized in a state where phosphorous is doped therein; and, FIGS. 6A–6F illustrate the steps of a method for fabricating an LCD in accordance with a first embodiment of the present invention.

FIG. 5B illustrates the TEM photograph of a polycrystalline silicon thin film crystallized in a state phosphorous where is doped therein.

In detail, FIG. 5A illustrates the TEM photograph of a polycrystalline silicon thin film obtained by crystallizing an undoped amorphous silicon thin film, wherein it can be noted that a form of grain crystallized by a typical FE-MIC is shown. That is, it can be shown that crystallized nuclei of nickel silicide are formed in the amorphous silicon thin film, and needle-like crystalline forms are extended from the nuclei, to form grains with a size which is not large throughout the thin film.

On the other hand, FIG. 5B illustrates a TEM photograph of a polycrystalline silicon thin film obtained by crystallizing an amorphous silicon thin film doped with a dose of about $7.95 \times 10^{13}$ atom/cm$^2$, wherein it can be noted that the grains are grown to a size in a range of approx. ~18 $\mu$m. The polycrystalline silicon thin film is obtained by depositing nickel on an a phosphorous doped amorphous silicon thin film at average at about $3.09 \times 10^{13}$ cm$^{-2}$, and annealing at about 520° C. for three hours under a nitrogen atmosphere.

A method for fabricating an LCD having the method for crystallizing an amorphous silicon in accordance with a first embodiment of the present invention applied thereto will be explained.

FIGS. 6A–6F illustrate the steps of a method for fabricating an LCD in accordance with another embodiment of the present invention.

Figure 6A:
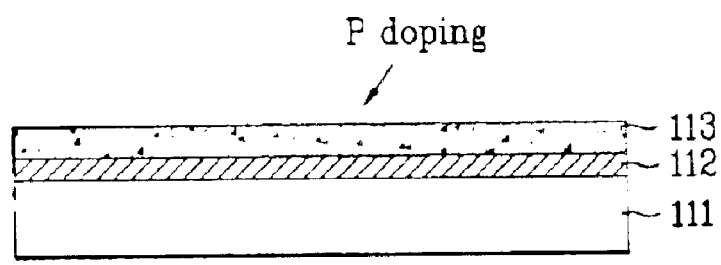

Referring to FIG. 6A, a silicon oxide SiO$_2$ film buffer layer 112, is formed on a substrate 111, and an amorphous silicon thin film 113 is formed on the silicon oxide film 112 by plasma CVD.

After impurities, such as phosphorous, fluoride, or chloride, are injected into the amorphous silicon thin film 113, the amorphous silicon thin film 113 is heat treated, to activate the impurities. The impurities are injected by an ion beam at a dose of about $10^{11}$–$10^{13}$ cm$^{-2}$.

Figure 6B:
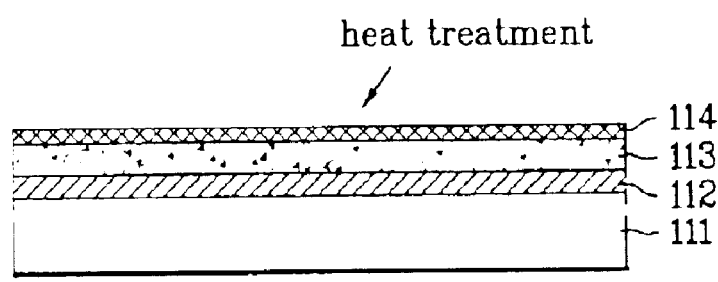

Next, referring to FIG. 6B, the amorphous silicon thin film 113 is heat treated, and a catalytic metal 114, such as nickel or cobalt, is deposited thereon. The catalytic metal 114 is deposited by using plasma of a non-reactive gas, by an ion beam, or by a metal solution, in a range of about $5 \times 10^{12}$–$10^{14}$ particles/cm$^2$.

Then, the amorphous silicon thin film 113 having the catalytic metal 114 deposited thereon is heat treated, for form a silicide phase NiSi$_2$ by diffusion of the catalytic metal 114 from an interface with the silicon layer to the silicon layer.

Figure 6C:
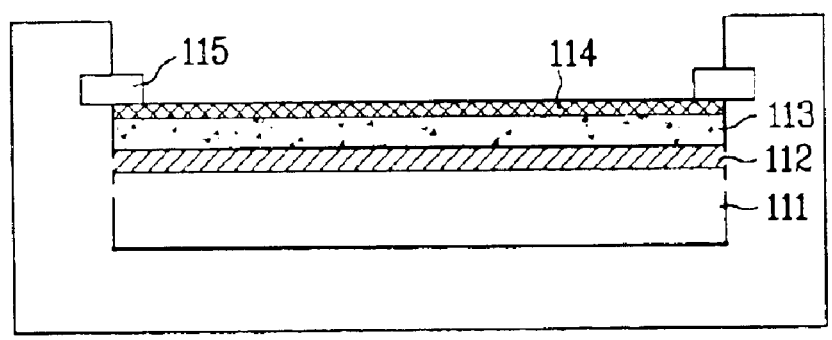

Referring to FIG. 6C, electrodes 115 are provided on opposite ends of the amorphous silicon thin film 113, and an electric field with an intensity of about 1–500 V/cm is applied thereto, so that needle-like grain phases are extended centered on the silicide, and crystallize the entire thin film 113.

In this instance, the annealing may be carried out simultaneously with, or after the application of the electric field. The electrodes are formed of molybdenum (Mo), or graphite, and the electric field has an intensity varied with time.

Thus, by crystallizing an impurity doped amorphous silicon thin film by FE-MIC, a polycrystalline silicon thin film having a larger sized grain and an enhanced crystallinity can be obtained because the nucleation rate is decreased and the grain growth rate increases because of the doped impurities.

Figure 6D:
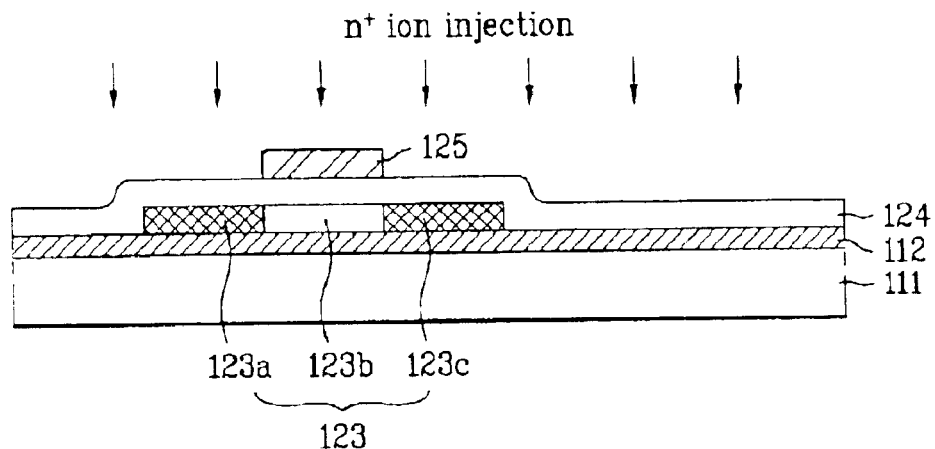

Referring to FIG. 6D, after the crystallization, the polycrystalline silicon thin film is patterned, to form a semiconductor layer 123, and an insulating film of silicon nitride or the like are sputtered on an entire surface including the semiconductor layer 123, to form a gate insulating film 124 with a thickness of about 1800 Å.

A low resistance metal is deposited on the gate insulating film 124 to a thickness about 3000 Å, and patterned by photolithography to form a gateline and a gate electrode 125 branched from the gateline.

Then, n$^+$ impurities are ion injected into the semiconductor layer 123 with the gate electrode 125 used as a mask, and the injected ions are activated by laser irradiation or high temperature heat treatment in a range of about 450° C., to form source/drain regions 123a/123c and a channel region 123b.

Figure 6E:
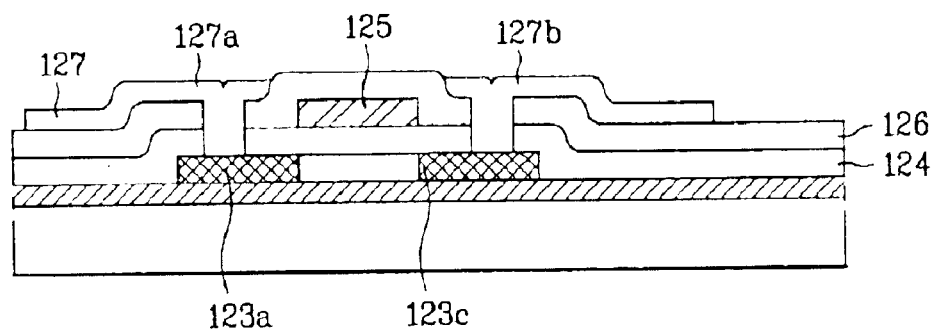

Referring to FIG. 6E, an insulating film of silicon nitride with a low dielectric constant is deposited on an entire surface including the gate electrode 125 by plasma CVD, to form an interlayer insulating film 126, and the interlayer insulating film 126 and the gate insulating film 124 are removed selectively, to expose a part of each of the source/drain regions 123a/123c.

Then, a low resistance metal is deposited on the interlayer insulating film 126, patterned by photolithography, to form a dataline 127 crossing the gateline and source/drain electrodes 127a/127b connected to the source/drain regions 123a/123c.

The semiconductor layer of polycrystalline silicon, the gate electrode, and the source/drain electrodes form a polycrystalline silicon thin film transistor arranged at a point where the gateline and the dataline are crossed.

Figure 6F:
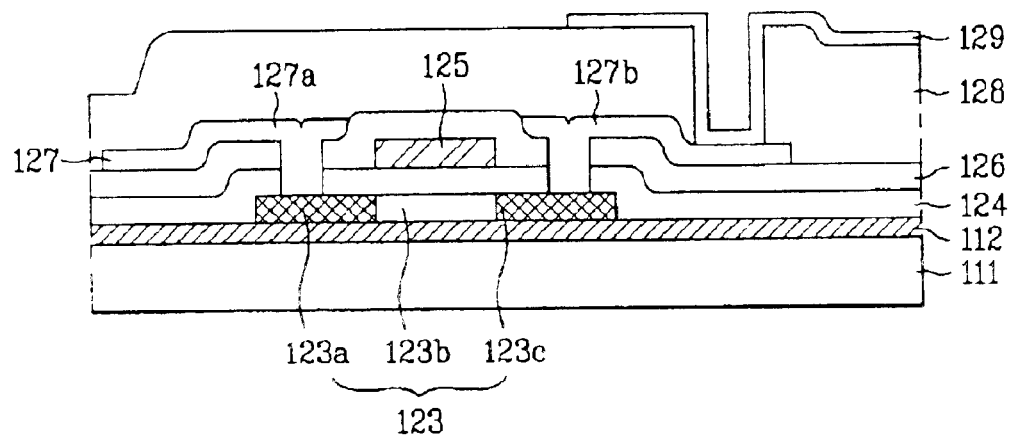

In succession, referring to FIG. 6F, an insulating film such as benzocyclobutene (BCB), acrylic resin, silicon nitride, or the like, is formed on an entire surface including the source/drain electrodes 127a/127b, to form a protection film 128.

A transparent conductive film of indium tin oxide (ITO) or the like is deposited on the protection film 128, and patterned, to form a pixel electrode 129 connected to the drain electrode 127b.

By bonding a color filter substrate to the fabricated array substrate opposite thereto and forming a liquid crystal layer between the substrates, fabrication of an LCD is completed.

The foregoing method for fabricating an LCD having the first embodiment of the method for crystallizing an amorphous silicon film applied thereto may have a variety of embodiments.

As has been explained, the method for crystallizing an amorphous film, and the method for fabricating an LCD by using the same have the following advantages.

First, the relative reduction of an incubation time and a nucleation rate and acceleration of a grain growth rate by crystallization of impurity doped amorphous silicon film by FE-MIC provides a large sized and high quality polycrystalline silicon grains, thereby enhancing crystallinity and mobility of a device thereof.

Second, in place of the polycrystalline silicon thin film crystallized by a laser beam used presently, the polycrystalline silicon thin film of the present invention can be used as a polycrystalline silicon thin film required for a thin film transistor LCD, solar cells, image sensors, and the like. Moreover, the advantage of availability of low temperature fabrication may replace a polycrystalline silicon thin film formed by a high temperature solid state crystallization.

It will be apparent to those skilled in the art that various modifications and variations can be made in the method for crystallizing an amorphous film and the method for fabricating a liquid crystal display (LCD) by using the same of the present invention without departing from the spirit or scope of the invention. Thus, it is intended that the present invention cover the modifications and variations of this invention provided they come within the scope of the appended claims and their equivalents.

What is claimed is:

1. A method for crystallizing an amorphous film, comprising:

forming an amorphous film containing an impurity on a substrate;

forming a metal layer directly on the amorphous film;

heat treating the amorphous film; and applying an electric field with an intensity greater than 0 V/cm to crystallize the amorphous film after heat treating the amorphous film.

2. A method of claim 1, wherein the impurity is provided in the amorphous silicon film by doping.

3. A method of claim 1, further comprising forming a buffer layer before forming an amorphous film containing an impurity on a substrate.

4. A method of claim 1, wherein forming a metal layer on the amorphous film and heat treating the amorphous film are carried out simultaneously.

5. A method of claim 1, wherein applying an electric field to the amorphous film is carried out before or after the step of heat treating the amorphous film.

6. A method of claim 1, further comprising heat treating the amorphous film after forming an amorphous film containing an impurity on a substrate.

7. A method of claim 1, wherein the electric field is varied with time.

8. A method of claim 1, wherein the electric field has an intensity greater than 0 V/cm and less than or equal to about 500 V/cm.

9. A method of claim 1, wherein the metal layer contains about $5 \times 10^{12} - 10^{14}$ particles/cm$^2$.

10. A method of claim 9, wherein the metal is nickel (Ni) or cobalt (Co).

11. A method of claim 1, wherein the metal layer is formed by one of plasma, an ion beam, and a metal solution.

12. A method of claim 1, wherein the impurity is one of phosphorus (P), fluoride (F), and chloride (Cl).

13. A method of claim 2, wherein the ion beam is employed for the doping of the impurity.

14. A method of claim 1, wherein the impurity has an amount of about $10^{11} - 10^{13}$ particles/cm$^2$.

15. A method of claim 1, wherein the amorphous film is formed of amorphous silicon.

16. A method of claim 1, wherein the metal layer contains amorphous silicon.

17. A method for fabricating a liquid crystal display, comprising:

forming an amorphous thin film containing an impurity on a first substrate;

forming a metal layer directly on the amorphous thin film;

heat treating, and then applying an electric field with an intensity greater than 0 V/cm to the amorphous film to crystallize the amorphous film;

patterning the crystallized amorphous silicon thin film to form a semiconductor layer;

forming a gate electrode in a region of the semiconductor layer insulated from the semiconductor layer;

forming source/drain regions by injecting ions into the semiconductor layer;

forming source/drain electrodes connected to the source/drain regions, respectively;

forming a pixel electrode connected to the drain electrode; and forming a liquid crystal layer between the first substrate and a second substrate opposite to the first substrate.

18. A method of claim 17, wherein the metal layer contains about $5 \times 10^{12} - 10^{14}$ particles/cm$^2$.

19. A method of claim 18, wherein the metal is nickel (Ni) or cobalt (Co).

20. A method of claim 17, wherein the metal layer contains amorphous silicon.

21. A method of claim 17, wherein the impurity is one of phosphorus (P), fluoride (F), and chloride (Cl).

22. A method of claim 17, wherein the impurity has an amount of about $10^{11} - 10^{13}$ particles/cm$^2$.

23. A method of claim 17, wherein the impurity is provided in the amorphous silicon film by doping.

24. A method of claim 17, further comprising forming a buffer layer before forming an amorphous thin film containing an impurity on a first substrate.

25. A method of claim 17, wherein the heat treating of, and the applying of the electric field to the amorphous film to crystallize the amorphous film is carried out simultaneously.

26. A method of claim 17, wherein the heat treating of, and the applying of the electric field to the amorphous film to crystallize the amorphous film is not carried out simultaneously.

27. A method of claim 17, wherein the electric field is varied with time.

28. A method of claim 17, wherein the electric field has an intensity greater than 0 V/cm and less than or equal to about 500 V/cm.

29. A method of claim 17, further comprising:

forming a gateline together with the gate electrode; and forming a dataline crossing the gateline together with the source/drain electrodes.

30. A method of claim 17, further comprising:

forming an insulating film on an entire surface inclusive of the gate electrode after forming a gate electrode in a region of the semiconductor layer insulated from the semiconductor layer.

31. A method of claim 30, wherein the insulating film is formed of silicon nitride or silicon oxide.

32. A method of claim 17, further comprising forming a protection film which exposes a part of the drain electrode after forming source/drain electrodes connected to the source/drain regions, respectively.

33. A method of claim 32, wherein the protection film is formed of one of BCB, acrylic resin, silicon nitride, and silicon oxide.

* * * * *